US012302535B2

(12) United States Patent
Wang et al.

(10) Patent No.: US 12,302,535 B2
(45) Date of Patent: May 13, 2025

(54) MODULAR AIR COOLING DEVICE AND COOLING SYSTEM

(71) Applicant: Beijing Bytedance Network Technology Co., Ltd., Beijing (CN)

(72) Inventors: Jian Wang, Beijing (CN); Bin Lin, Beijing (CN); Zhichao Lv, Beijing (CN); Shifeng Wang, Beijing (CN); Yulong Wang, Beijing (CN); Ruidong Wang, Beijing (CN)

(73) Assignee: Beijing Bytedance Network Technology Co., Ltd., Beijing (CN)

( * ) Notice: Subject to any disclaimer, the term of this patent is extended or adjusted under 35 U.S.C. 154(b) by 0 days.

(21) Appl. No.: 18/772,829

(22) Filed: Jul. 15, 2024

(65) Prior Publication Data

US 2024/0381581 A1 Nov. 14, 2024

Related U.S. Application Data (63) Continuation of application No. PCT/CN2023/071092, filed on Jan. 6, 2023.

(30) Foreign Application Priority Data

Jan. 14, 2022 (CN) .......................... 202210042941.6

(51) Int. Cl.
*H05K 7/20* (2006.01)

(52) U.S. Cl.
CPC ..... *H05K 7/20736* (2013.01); *H05K 7/20154* (2013.01); *H05K 7/20236* (2013.01); *H05K 7/20781* (2013.01)

(58) Field of Classification Search
CPC ........... H05K 7/20781; H05K 7/20754; H05K 7/20736; H05K 7/20154
See application file for complete search history.

(56) References Cited

U.S. PATENT DOCUMENTS 8,058,802 B2 * 11/2011 Li ...................... H05K 7/20963
313/506
9,848,509 B2 * 12/2017 Shedd ..................... F28D 15/00
(Continued)

FOREIGN PATENT DOCUMENTS

| CN | 102461355 A | 5/2012 |
| CN | 104039114 A | 9/2014 |

(Continued)

OTHER PUBLICATIONS

International Search Report for PCT Patent Application No. PCT/CN2023/071092, mailed on Mar. 15, 2023, 3 pages.
(Continued)

*Primary Examiner* — Mukundbhai G Patel (57) ABSTRACT

The embodiments of the present disclosure provide a modular cooling device and a cooling system. The device includes: an air cooling box adapted to sealingly receive a predetermined number of electronic devices to be cooled; and a heat exchange unit coupled to the air cooling box and comprising: a housing sealingly enclosing a heat exchange chamber, the heat exchange chamber sealingly connecting with an interior of the air cooling box to allow air to circulate between the interior of the air cooling box and the heat exchange chamber as an effect of fans of the electronic devices; and a heat exchanger arranged in the heat exchange chamber and comprising paths for enabling circulating air to circulate; and a cooling interface at least partly arranged on the housing and adapted to allow a cooling medium to circulate between an external cold source and an interior of the heat exchanger.

19 Claims, 5 Drawing Sheets (56) References Cited

U.S. PATENT DOCUMENTS

| | | | |
|---|---|---|---|
| 9,945,142 B2* | 4/2018 | Maselli | ............... E04H 5/02 |
| 10,136,559 B2 | 11/2018 | Heydari | |
| 10,334,763 B2 | 6/2019 | Gao et al. | |
| 2005/0235671 A1 | 10/2005 | Belady et al. | |
| 2008/0232064 A1* | 9/2008 | Sato | ............... H05K 7/20754 |
| | | | 361/679.49 |
| 2009/0086432 A1* | 4/2009 | Campbell | ......... H05K 7/20754 |
| | | | 165/104.21 |
| 2017/0188483 A1 | 6/2017 | Heydari et al. | |
| 2021/0368655 A1* | 11/2021 | Gao | ............... H05K 7/20836 |

FOREIGN PATENT DOCUMENTS

| CN | 204104274 U | 1/2015 |
|---|---|---|
| CN | 206459291 U | 9/2017 |
| CN | 108990396 A | 12/2018 |
| CN | 112672611 A | 4/2021 |
| CN | 113301766 A | 8/2021 |
| CN | 114206086 A | 3/2022 |
| CN | 217241208 U | 8/2022 |

OTHER PUBLICATIONS

First Office Action for Chinese Application No. 202210042941.6, mailed Aug. 30, 2024, 18 pages.
International Preliminary Report on Patentability for International Application No. PCT/CN2023/071092, mailed Jul. 25, 2024, 13 pages.
Rejection Decision for Chinese Application No. 202210042941.6, mailed Mar. 6, 2025, 10 Pages.
The Extended European Search Report for European Application No. 23739930.8, mailed on Mar. 17, 2025, 10 pages.

* cited by examiner

MODULAR AIR COOLING DEVICE AND COOLING SYSTEM

The present disclosure a Continuation Application of International Patent Application No. PCT/CN2023/071092, filed Jan. 6, 2023, which claims the priority to the CN patent application Ser. No. 20221.0042941.6, entitled "MODULAR AIR COOLING DEVICE AND COOLING SYSTEM", filed in the China National Intellectual Property Administration on Jan. 14, 2022, the contents of which are hereby incorporated by reference in their entirety.

FIELD

Embodiments of the present disclosure generally relate to the field of data centers, and more specifically, to a modular air cooling device and a cooling system for providing cooling for a data center.

BACKGROUND

With the advent of the 5G era of the Internet of Everything, there is an increasing demand for high-performance and high-density computing, and the energy consumption problem in the data center is becoming salient. Nowadays, data centers have been officially included in the new infrastructure.

New infrastructure imposes higher requirements for the heat dissipation solution for data centers and the overall energy efficiency. On one hand, as known in the art, if heat dissipation is poor, the operation stability of the chips will be reduced due to high temperature, and an excessive thermal stress generated due to a temperature difference between the interior of the module and the external environment will influence the electrical performance, the operating frequency, the mechanical strength and reliability. The failures of the electronic devices are increased exponentially with the increase of operating temperature. Specifically, temperature of a single semiconductor component is increased by 10° C., the system reliability may be reduced by 50%. The legacy data-center cooling solution cannot meet the needs for efficient heat dissipation of electronic information devices. On the other hand, the central and local governments as well as industries have adopted energy policies and put forward higher requirements for energy saving indicators of data centers. To deal with the "power wall" of big data or ultra-density computing, it is a technological revolution in future data centers to replace the air with a liquid coolant to cool the computing device. However, for current electronic devices used in some data centers, the liquid cooling solution is not feasible, which brings difficulties to liquid cooling deployment in those data centers.

SUMMARY

Embodiments of the present disclosure provide a modular air cooling device and a cooling system, to at least partly solve the above-mentioned problem in the prior art and other potential problems.

In an aspect of the present disclosure, there is provided a modular air cooling device. The modular air cooling device comprises: an air cooling box adapted to sealingly receive a predetermined number of electronic devices to be cooled; and a heat exchange unit coupled to the air cooling box and comprising: a housing sealingly enclosing a heat exchange chamber, the heat exchange chamber sealingly connecting with an interior of the air cooling box to allow air to circulate between the interior of the air cooling box and the heat exchange chamber as an effect of fans of the electronic devices; and a heat exchanger arranged in the heat exchange chamber and comprising paths for enabling circulating air to circulate; and a cooling interface at least partly arranged on the housing and adapted to allow a cooling medium to circulate between an external cold source and an interior of the heat exchanger to cool air flowing through the heat exchange.

With the deployment, the modular air cooling device according to embodiments of the present disclosure is formed by attaching heat exchange units, which have an internal circulation capability and include external circulation interfaces, with the air cooling box. Deployment of the air cooling device according to the embodiments of the present disclosure can be completed by coupling the reserved interface of the data center to the cooling interfaces of the air cooling devices, and a distributed cooling system can be formed accordingly. In addition, the modular air cooling device according to the embodiments of the present disclosure can also be deployed together with immersion liquid cooling devices, making it possible to deploy, in the liquid cooling system, electronic devices unable to be cooled through liquid cooling. In this way, the efficient cooling capability of the liquid cooling device can be used while the compatibility of the liquid cooling system can be improved. Furthermore, a user can select a different number of air cooling devices and/or liquid cooling devices according to the scale. As long as a certain number of interfaces are reserved, the user can increase or decrease the required air cooling devices and/or liquid cooling devices at any time. In the case, the deployment of cooling devices of the data center can be more flexible while the deployment efficiency can be improved significantly, to thus achieve carbon neutrality.

In some embodiments, the modular air cooling device further comprises: a mount rack for adopting the air cooling box and the heat exchange unit such that the heat exchange unit is arranged to a side of the air cooling box adjacently to the air cooling box. With the arrangement of the mounting rack for supporting the air cooling box and the heat exchange unit, the cooling device can be deployed easily.

In some embodiments, the heat exchange unit is detachably adopted in the mount rack. Such arrangement facilitates mounting and maintenance of the heat exchange unit or even the whole air cooling device.

In some embodiments, the predetermined number of electronic devices is arranged in the air cooling box along an arrangement direction, and the air cooling box and the heat exchange unit) are arranged along the arrangement direction, and a width of the modular air cooling device in the arrangement direction is not greater than 1.5 times a height of the modular air cooling device. In this way, a miniaturized air cooling device can be attained. Miniaturization introduces lots of advantages, for example, more flexible adjustment according to the cooling scale, to thus improve the utilization rate of the air cooling system. Furthermore, miniaturization enables accurate cooling control of electronic devices.

In some embodiments, the width of the modular air cooling device in the arrangement direction is less than the height of the modular air cooling device.

In some embodiments, the width of the modular air cooling device is less than half of the height of the modular air cooling device in the arrangement direction. Thus, the air cooling device can be further miniaturized, to provide more convenience in maintenance of the electronic devices disposed therein.

In some embodiments, the heat exchange unit further comprises: a chiller arranged in the heat exchange chamber and connected between the cooling interface and the heat exchanger to adjust a temperature of the cooling medium entering the heat exchanger from the external cold source below a predetermined temperature. Thus, the cooling efficiency can be further improved.

In some embodiments, the modular air cooling device further comprises: a circulation through hole arranged between the air cooling box and the heat exchange chamber to allow the air to circulate between the air cooling box the heat exchange chamber.

In some embodiments, the circulation through hole comprises: an upper opening arranged on a top of the electronic devices or extending to a part above the top of the electronic devices in a vertical direction; and a lower opening arranged on a top of the electronic devices or extending to a part below the top of the electronic devices in the vertical direction. This arrangement is advantageous for overall cooling of the electronic devices and air circulation in the air cooling box and the heat exchange chamber.

In some embodiments, the cooling interface comprises at least two sets of cooling interfaces. In this way, a redundant arrangement is provided for the cooling interface, to further improve cooling efficiency.

In some embodiments, the air cooling box comprises: an air cooling groove configured to adopt the predetermined number of the electronic devices and comprising a top opening for operating the electronic devices; and a cover body coupled to the air cooling groove to seal a top opening of the air cooling groove. This arrangement facilitates maintenance of the electronic devices disposed therein.

In some embodiments, the air cooling groove further comprises a bottom opening and a baffle sealingly covering the bottom opening, and the cover body and the baffle are capable to be opened automatically or manually to achieve emergency heat dissipation via the top opening and the bottom opening. In this way, a failsafe mechanism can be implemented, i.e., emergency heat dissipation can be provided upon failure of the air cooling device or system, to thus avoid loss caused by overheating of the electronic devices while improving the reliability of the cooling system.

In some embodiments, the cover body is rotatably coupled to the air cooling groove via a hinge. This can further facilitate maintenance of the electronic devices in the cooling groove, to thus improve the maintenance efficiency.

In a second aspect of the present application, there is provided a cooling system for an electronic device. The cooling system comprises: at least one of the modular air cooling device according to the first aspect as described above; and a cooling medium circulation device coupled to a cooling interface of the at least one modular air cooling device and adapted to allow the cooling medium to circulate between an external cold source and the heat exchanger.

In some embodiments, the at least one modular air cooling device comprises a plurality of modular air cooling devices, and the cooling system further comprises a plurality of reserved interfaces, the plurality of reserved interfaces being adapted to be coupled to the cooling interface.

In some embodiments, the cooling system further comprises: a base comprising a plurality of adaption portions arranged at predetermined positions, the base being for arrangements of the plurality of modular air cooling devices, the plurality of adaption portions being corresponded to the plurality of reserved interfaces. In the case of a large-scale deployment of electronic devices such as servers, the datacenter deployment time can be further shortened by arranging a base in advance.

In some embodiments, the cooling system further comprises: a plurality of immersion liquid cooling devices, each immersion liquid cooling device being adapted to cool the electronic device immersed therein, and having a size identical to a size of the modular air cooling device, and each immersion liquid cooling device being adapted to be arranged in the cooling system interchangeably with the modular air cooling device. In this way, the modular air cooling device can be deployed with the immersion liquid cooling devices, to allow the electronic devices, which cannot be cooled through liquid cooling, to be deployed in the liquid cooling system. Therefore, the efficient cooling capability of the liquid cooling device can be utilized while the compatibility of the liquid cooling system can be improved.

In some embodiments, the cooling medium comprises deionized water. The deionized water can effectively prevent corrosion and impact on the internal structure of the heat exchanger and the metal of the cooling pipes, to thus improve the reliability of the liquid cooling system.

In a third aspect of the present disclosure, there is provided a cooling system with a large-scale cluster deployment. The cooling system comprises: a base comprising a plurality of adaption portions arranged at predetermined positions; a plurality of reserved interfaces corresponding to the positions of the plurality of adaption portions; an auxiliary cooling device configured between the plurality of reserved interfaces and an external cold source; a plurality of the modular air cooling devices according to the first aspect as described above arranged in a part of the plurality of adaption portions, cooling interfaces of the modular air cooling devices being coupled to the plurality of reserved interfaces; and a plurality of immersion liquid cooling devices arranged in another part of the plurality of adaption portions and each comprising a cold source interface coupled to the reserved interface. In the case of a large-scale cluster deployment of a cooling device, a base and reserved interfaces are arranged in advance in the data center, the liquid cooling devices and the air cooling devices are arranged in advance in the data center room, and the water supply and return pipelines on the side of the external cold source are connected and debugged in advance, without arrangement of the electronic devices in advance, to thus form a liquid cooling system with a large-scale cluster deployment including air cooling devices. In this way, the efficient cooling capability of the liquid cooling device can be utilized while the compatibility of the liquid cooling system can be improved. Electronic devices are purchased as required and deployed in the system, and the coolant is then filled into the liquid cooling device having electronic devices placed therein. At this time, deployment of the entire data center is completed. As such, the data-center deployment time can be shortened greatly.

In some embodiments, the modular air cooling device and the immersion liquid cooling device have a same size. This arrangement facilitates the hybrid deployment of the air cooling device and the liquid cooling device, to thus improve compatibility of the liquid cooling system.

It would be appreciated that this Summary is not intended to identify key features or essential features of embodiments of the present disclosure, nor is it intended to be used to limit the scope of the present disclosure. Other features of the present disclosure will become evident through the following description.

BRIEF DESCRIPTION OF THE DRAWINGS

The above and other objectives, features and advantages of the present disclosure will become more apparent, through the following detailed description with reference to the accompanying drawings. Throughout the drawings, the same or similar reference symbols refer to the same or similar components, where.

DETAILED DESCRIPTION OF EMBODIMENTS

Reference will now be made to various example embodiments as shown in the drawings to describe the principle of the present disclosure. It would be appreciated that the description on those embodiments are provided only to enable those skilled in the art to better understand and further carry out the present disclosure, without suggesting any limitation to the scope of the present disclosure. It is to be noted that the similar or same reference symbols throughout the drawings, if possible, may be employed and represent the similar or same functions. Those skilled in the art would easily realize that, in the description below, alternative embodiments of the structure and the method described herein can be employed, without departing from the principle of the present disclosure.

Nowadays, the Internet has become the core drive of the Fourth Industrial Revolution. Along with the industrial revolution, human life is changing in all aspects, in particular a surging demand for data traffic, and a significantly increase in network load. High-speed network connection is desired all over the world for network communications, which is the key to the Internet of Everything. As one of the important infrastructure supporting the high-speed network connection, the data center is responsible for processing and transmitting massive data, and in the process, a large amount of waste heat is generated.

In order to cool the data center, according to an air cooling solution, 1200CFM cooling air per minute is required for a 10.5 kW server rack. The flow rate of the air per minute can fill a machine room with an area of 11 m² and a height of 3 m. Thus, it takes a large amount of energy to move the air. At present, a liquid cooling system can provide a better cooling performance than the air cooling system, and occupies a smaller space than the latter and therefore requires a much smaller room. In other words, an optimized liquid cooling solution can enable the data center to provide more computing capabilities in a smaller space.

An immersion liquid cooling system, as a liquid cooling system, achieves heat dissipation by immersing electronic devices, for example, servers or the like, in a non-conductive liquid, to control temperature of the electronic devices within a reasonable range. It is the trend of the data center construction to deploy an immersion liquid cooling system. However, since the immersion liquid cooling technology is still in its infancy, a plurality of current electronic devices does not support immersion liquid cooling. However, the electronic devices are a must in a data center room, leading to a difficulty in deployment of immersion liquid cooling devices.

For those electronic devices unable to be cooled through liquid cooling, the legacy solution includes a specific air cooling system independent of the liquid cooling system to cool those electronic devices. In the case, costs are increased, and there arises the problem that the electronic devices in the air cooling system and the liquid cooling system are interconnected. In addition, various problems with respect to compatibility and support may be generated since electronic devices with different power consumption in different ambient temperatures are placed in the same large air cooling groove.

In order to solve, or at least partly, solve the problems of cooling electronic devices 200 that can only be cooled through air cooling in the background of the development of immersion liquid cooling systems, a modular air cooling device 100 is provided according to embodiments of the present disclosure. The modular air cooling device 100 is an apparatus for cooling electronic devices 200 through air cooling. Hereinafter, the idea of the present disclosure will be described with the electronic devices 200 being examples of various types of servers used in the data center. Various types of servers cooled using the air cooling device 100 according to the embodiments of the present disclosure may include, but are not limited to, storage servers, computing servers, storage and computing integrated servers, and the like. It would be appreciated that the modular air cooling device 100 according to the embodiments of the present disclosure can also be applied in any other appropriate occasion where electronic devices 200 need to be cooled.

Figure 1:
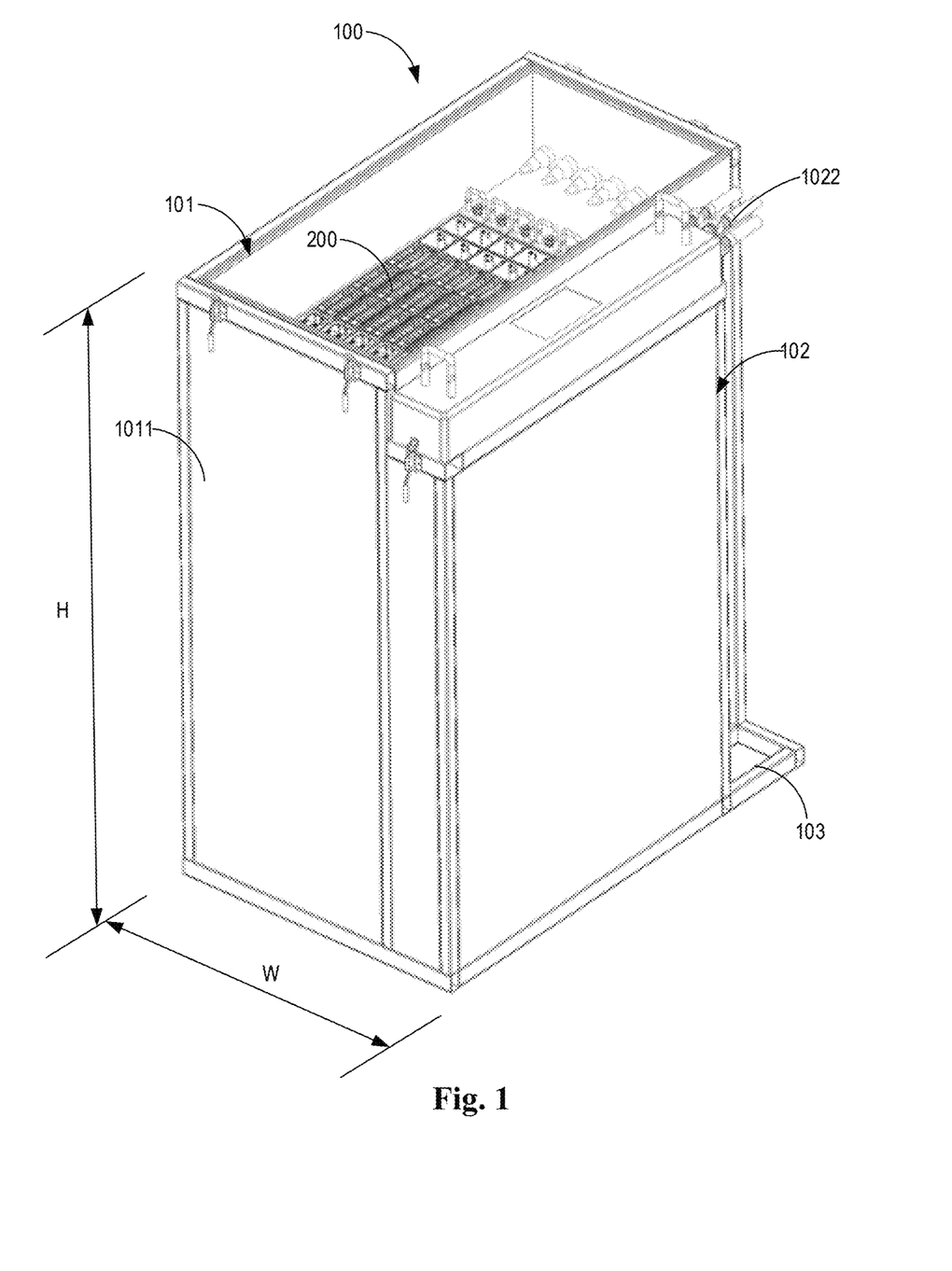
FIG. 1 is a three-dimensional view of a modular air cooling device according to embodiments of the present disclosure, where a cover body is not shown to expose electronic devices therein.

FIG. 1 is a three-dimensional view of a modular air cooling device 100 according to embodiments of the present disclosure. As shown therein, the modular air cooling device 100 according to the embodiments of the present disclosure generally includes an air cooling box 101 and a heat exchange 102. The air cooling box 101 is a device for receiving electronic devices 200. In some embodiments, the air cooling box 101 may include an air cooling groove 1011 and a cover body 1012. The air cooling box 1011 incudes a top opening. Through the top opening, a user can operate (e.g. place or remove) and maintain the electronic devices 200 to be cooled.

The cover body 1012 is coupled to the air cooling groove 1011 to seal the top opening of the air cooling groove 1011. Therefore, the electronic devices 200 are sealingly received in the air cooling box 101. In some embodiments, the cover body 1012 is rotatably arranged on the air cooling groove 1011 via a hinge or the like. When the electronic devices 200 need to be maintained, the cover body 1012 can be opened by operating the same to rotate about the hinge. In order to achieve sealing, a sealing ring may be provided at a position where the cover body 1012 mates with the air cooling groove 1011.

As would be appreciated, the embodiment where the cover body 1012 is coupled to the air cooling groove 1011 via a hinge or the like is provided only as an example, without any intention to limit the protection scope of the present disclosure. Other appropriate manner or arrangement is also feasible. For example, in some alternative embodiments, the cover body 1012 can be directly disposed on the air cooling groove 1011, and can be wholly removed from the air cooling groove 1011.

In some embodiments, in addition to the top opening, the air cooling groove 1011 may include a bottom opening and a baffle for sealingly covering the bottom opening. Moreover, the cover body 1012 and the baffle can be manually or automatically opened or closed to achieve emergency heat dissipation. For example, when the system control module detects that the air cooling device 100 failed or the circulating water of the whole cooling system failed, the control module can control the cover body 1012 and the baffle to open. In the circumstance, the electronic devices 200 in the air cooling groove 1011 can dissipate heat by means of the external environment of the room where the cooling system is located, and cold air enters from the top opening after the cover body 1012 is opened. The cold air becomes hot air after taking heat away from the electronic devices 200, and the hot air then escapes from the bottom opening, to thus implement a failsafe mechanism, i.e., emergency heat dissipation of the electronic devices 200 when the air cooling device 100 or the cooling system failed. In this way, the electronic devices 200 can be effectively prevented from being damaged due to overheating during a device or system failure, and the reliability of the cooling system can be improved accordingly.

After the failure is eliminated, the cover body 1012 and the baffle can be closed manually or automatically to restore the device to the normal cooling state. In addition, in order to prevent the position of the air cooling groove 1011 from hindering the opening of the baffle, in some embodiments, the bottom opening and the baffle can be arranged on the bottom wall of the air cooling groove 1011, on a sidewall close to the bottom wall, or at any other appropriate position. For example, when the bottom opening is arranged on the sidewall, the bottom opening may be arranged below the bottom of the electronic devices 200 or extend to a part below the bottom of the electronic devices 200 in the vertical direction, to dissipate heat for the whole electronic devices 200 and enable the air to flow during emergency heat dissipation. In some embodiments, in order to prevent foreign matters from entering, a filter screen may be arranged respectively on the top opening and the bottom opening.

Figure 2:
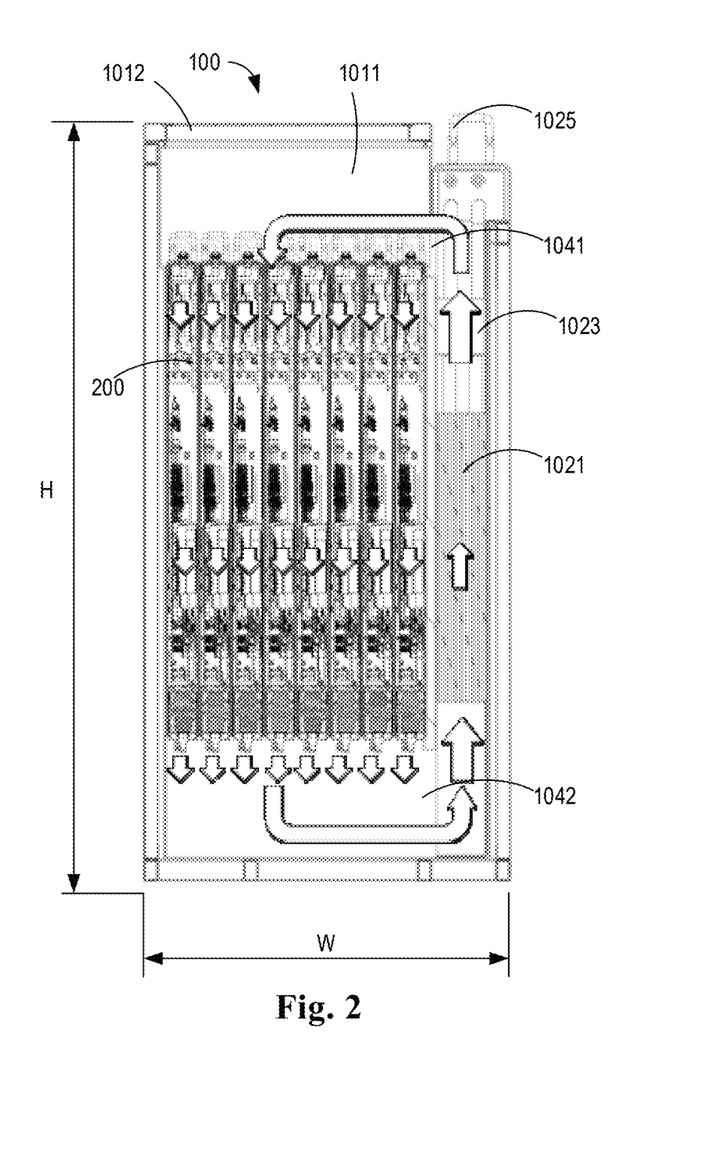
FIG. 2 is a side cross-sectional view of a modular air cooling device according to embodiments of the present disclosure.

A plurality of electronic devices 200 may be arranged in the air cooling groove 1011 along an arrangement direction. FIG. 2 is a side cross-sectional view of the air cooling device 100, where the electronic devices 200 arranged in the air cooling groove 1011 in the arrangement direction are shown. In some embodiments, in order to maximize the deployment density, the electronic devices 200 in the air cooling groove 1011 can be arranged substantially along the arrangement direction and vertically inserted in the air cooling groove 1011. In the air cooling groove 1011, in order to facilitate the arrangement of the electronic devices 200, a structure or module allowing insertion of electronic devices 200 may be provided. On one hand, the electronic devices 200 can be arranged fixedly in the air cooling groove 1001 at a greater density. On the other hand, an operator can maintain the electronic devices with less effort.

The heat exchange unit 102 is coupled to the air cooling box 101. In some embodiments, the heat exchange unit 102 and the air cooling box 101 can be arranged along the arrangement direction, i.e., the heat exchange unit 102 can be arranged on one side of the air cooling box 101. The heat exchange unit 102 includes a heat exchange chamber 1024 enclosed by a housing, a heat exchanger 1021 arranged in the heat exchange chamber 1024, and a cooling interface 1022 at least partly arranged on the housing. The heat exchange chamber 1024 sealingly connects with the interior of the air cooling box 101. For example, in some embodiments, the air cooling device 100 further includes a circulation through hole. The circulation through hole is arranged between the air cooling groove 1011 and the heat exchange chamber 1024 of the heat exchange unit 102. For example, in some embodiments, the circulation through hole may be arranged on a plate or wall between the air cooling groove 1011 and the heat exchange chamber 1024 of the heat exchange unit 102. With the circulation through hole, sealing circulation of the air can be achieved between the air cooling groove 1011 and the heat exchange chamber 1024 of the heat exchange unit 102. In some embodiments, a filter can be arranged on the circulation through hole to block foreign matters.

In some embodiments, the circulation through hole may include an upper opening 1041 arranged at an upper part, and a lower opening 1042 arranged at a lower part. The upper opening 1041 is arranged above the top of the electronic devices 200 or extend to a part above the top of the electronic devices 200 from an appropriate position in the vertical direction. Likewise, the lower opening 1042 may be arranged below the bottom of the electronic devices 200 to extend to a part below the bottom of the electronic devices 200 in the vertical direction. In addition, the two openings may have an appropriate area to allow the airflow meeting the cooling requirements to circulate between the air cooling groove 1011 and the heat exchange chamber 1024. In this way, the present disclosure can promote air circulation between the air cooling groove 1011 and the heat exchange chamber 1024, and is beneficial for the air to pass through the entire electronic devices 200 and take heat away from the latter.

As shown in FIG. 2, as an effect of fans of the electronic device 200, the air in the air cooling groove 1011 passes through the electronic devices 220 from top to bottom, and enters the heat exchange chamber 1024 from the lower opening 1042 after taking heat away from the electronic devices 200. As driven by the fans of the electronic devices 200, the hot air entering the heat exchange chamber 1024 flows from bottom to top and through the heat exchanger 1021. The heat exchanger 1021 includes paths for enabling the air to circulate. The hot air flows through the heat exchanger 1021 from the outside of the heat exchanger 1021 via these paths. The interior of the heat exchanger 1021 connects with an external cold source via the cooling interface 1022, and a cooling medium circulates between the external cold source 302 and the interior of the heat exchanger 1021. When flowing through the outside of the heat exchanger 1021, the hot air exchanges heat with the cooling medium inside the heat exchanger 1021 and is cooled into cold air, and the cold air then enters the air cooling groove 1011 from the upper opening 1041. The air inside the air cooling groove 1011 and the heat exchange chamber 1024 circulates repeatedly to cool the electronic devices 200 in the air cooling groove 1011.

On one hand, the bottom-up air circulation method in the air cooling groove 1011 can take more heat from the electronic devices 200. On the other hand, in the heat exchange chamber 1024 of the heat exchange unit 102, since the hot air is less dense than the cold air, the air, as being further driven by the drive force of the fans, can flow through the heat exchanger 1021 from bottom to top, to facilitate heat exchange of the air with the cooling medium inside the heat exchanger 1021 while improving the heat exchange efficiency. In some embodiments, in order to promote air circulation between the air cooling groove 1011 and the heat exchange chamber 1024, the air cooling device 100 may further include one or more circulation fans additionally arranged at the upper opening 1041 and/or the lower opening 1042.

For ease of deployment, the heat exchange unit 102 includes a cooling interface 1022 at least partly arranged on the housing of the heat exchange unit 102. The cooling interface 1022 is adapted to allow the cooling medium to circulate between the external cold source 302, for example, a cooling tower, and the heat exchanger 1021, to thus enable the cooling medium in the external cold source 302 and the air to exchange heat at the heat exchanger 1021. In some embodiments, the cooling medium may include deionized water. The deionized water can effectively prevent the corrosion and impact on the internal structure of the heat exchanger 1021 and the metal of the cooling pipelines, to thus improve the reliability of the liquid cooling system.

In some embodiments, the cooling interface 1022 may include at least two set of cooling interfaces. In this way, a redundant design of the cooling interface 1022 is provided. The capability of each set of cooling interfaces 1022 for handling the cooling medium can fully meet the circulation requirements of the cooling medium. In the circumstance, even though one set of the cooling interfaces 1022 is blocked or the like, it leaves no impact on the circulation of the cooling medium, thereby ensuring the cooling effect.

By integrating the heat exchange unit 102 and the air cooling box 101 having the internal circulation capability and the external circulation capability, a modular air cooling device 100 is formed. Deployment of the air cooling device 100 according to the embodiments of the present disclosure can be completed as long as the reserved ports of the data center are coupled to the cooling interface 1022 of the air cooling device. Accordingly, a distributed air cooling device 100 is formed. In this way, deployment of the air cooling device is significantly simplified.

Figure 3:
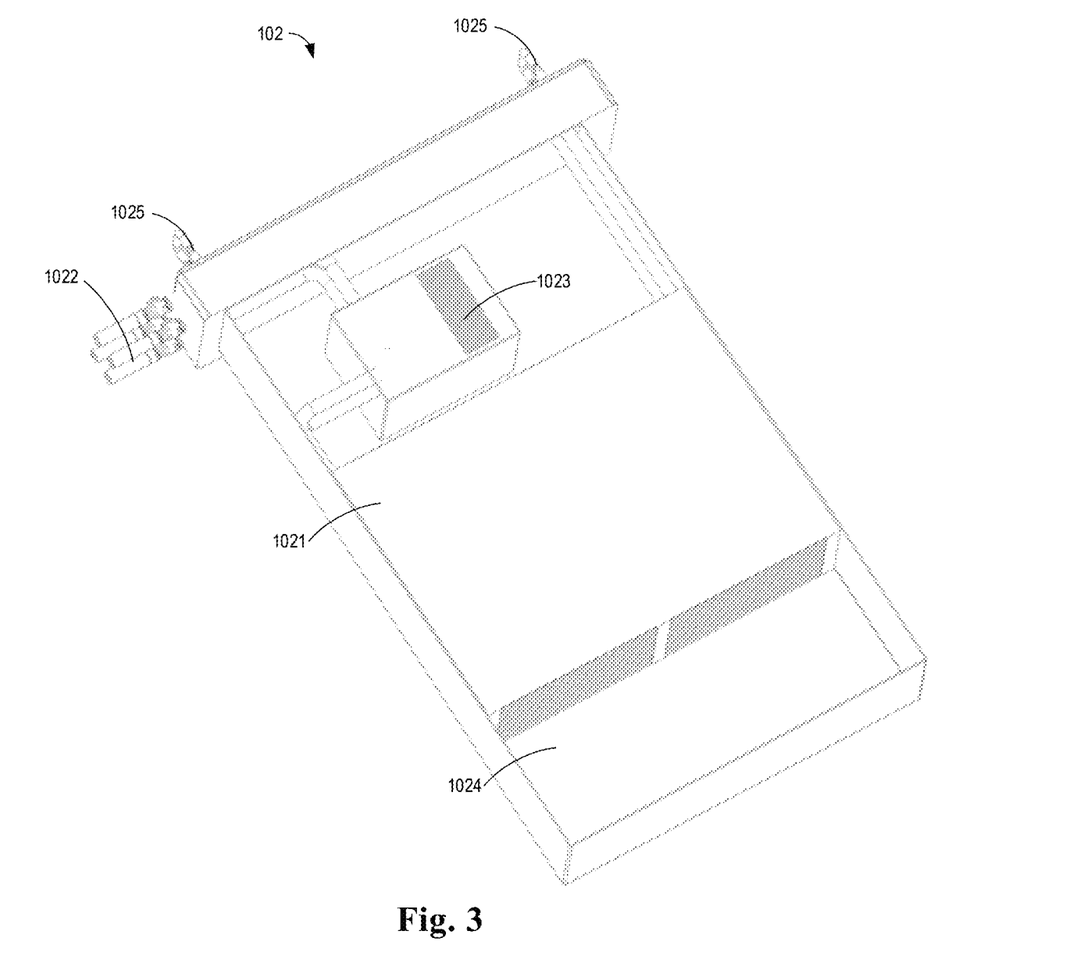
FIG. 3 is a three-dimensional view of a heat exchange unit according to embodiments of the present disclosure.

As can be seen from the above description, the heat exchanger 1021 according to the embodiments of the present disclosure adopts an air-liquid heat exchange mode where the hot air exchanges heat with the cooling medium in the heat exchanger 1021 to reduce temperature of the hot air. The temperature reducing effect of the hot air, or even the cooling effect of the electronic devices 200, is closely related with the temperature of the cooling medium. In order to further ensure the cooling effect, in some embodiments, the heat exchange unit 102 may further include a chiller 1023, as shown in FIGS. 2 and 3. The chiller 1023 is arranged in the heat exchange chamber 1024 and connected between the cooling interface 1022 and the heat exchanger 1021 to adjust the temperature of the cooling medium entering the heat exchanger 1021 below a predetermined temperature. For example, in some embodiments, the predetermined temperature may be 25° C., or may be lower than 25° C.

The working principle of the chiller includes: supplying cold by a compressor, cooling the cooling medium and controlling the temperature thereof, and transporting, by a circulation pump, the cooling medium having a temperature controlled at or below a predetermined temperature, to the heat exchanger 1021. With the chiller 1023, the temperature of the cooling medium entering the heat exchanger 1021 can be effectively controlled, and the electronic devices 200 therefore can be effectively cooled in time when the ambient temperature is high, to ensure safe and reliable operation of the electronic devices 200.

In some embodiments, a control device may also be arranged on the heat exchange unit 102, to at least control the predetermined temperature of the water out of the chiller 1023 and/or the temperature at which the chiller 1023 starts to operate. For example, in some embodiments, the temperature at which the chiller 1023 starts to operate may be set to 30° C. In the circumstance, upon detecting that the temperature of the cooling medium input to the heat exchanger 1021 (e.g., by a temperature sensor arranged at an inlet of the heat exchanger 1021) is greater than 30° C., the chiller 1023 starts to operate and controls the cooling medium to or below the predetermined temperature. In some embodiments, the control device can also directly control turn-on and turn-off of the chiller 1023. In some embodiments, the control device may further include a display unit. The display unit may include a touch unit, to control the chiller 1023. In some alternative embodiments, the control device may also include a button or the like to control the chiller 1023.

In addition, with the control device, parameters such as temperature of the water out of the chipper 1023, the start temperature, and the like, can be controlled based on the heat and the number of the electronic devices 200 to be cooled in the air cooling box 101 and other information, to improve the cooling efficiency while reducing the cooling costs. For example, in the case of a small number of electronic devices 200 arranged in the air cooling groove 1011 and less heat generated, the control device can increase the temperature of the water out of the chiller 1023 and/or the temperature at which the chiller 1023 starts to operate, to further reduce the operation costs. In some alternative embodiments, the control device may also display other information and/or control other components. For example, in some embodiments, the display unit of the control device may also display types and a number of electronic devices 200 to be cooled in the modular air cooling device 100, and the like.

In some embodiments, in order to facilitate deployment of the heat exchange unit 102 and the air cooling box 101, the modular air cooling device 100 according to embodiments of the present disclosure may further include a mount rack 103. The mount rack 103 may be a support structure for supporting the air cooling groove 1011 and the heat exchange unit 101. Although FIGS. 1 and 2 show that the mount rack 103 is substantially of a frame structure, it would be appreciated that the structure shown in FIGS. 1 and 2 is only provided illustratively, without suggesting any limitation to the protection scope of the present disclosure. Any other appropriate structure or arrangement is also feasible. For example, in some alternative embodiments, the mount rack 103 may be of a fully closed, or semi-closed, housing structure formed by a plate-shaped component.

In some embodiments, the air cooling box 101 may be fixedly arranged on a first part of the mount rack 103 while the heat exchange unit 1 102 may be arranged on a second part adjacent to the first part. In this way, the heat unit 102 is arranged on one side of the air cooling box 101 adjacently to the air cooling box 101. The air cooling box 101 may be fixedly arranged in the first part, for example, through welding, fastener connection, interference fit, and the like. The heat exchange unit 102 may be detachably arranged in the second part of the mount rack 103 to facilitate maintenance and replacement of the heat exchange unit 102.

In some embodiments, in order to save the space and facilitate arrangement, the first part of the mount rack 103 for supporting the air cooling box 101 and the second part of the mount rack for supporting the heat exchange unit 102 may differ in height. For example, the height of the part of the mount rack 103 for supporting the air cooling groove 1011 may be greater than that of the part for supporting the heat exchange unit 102, as shown in FIG. 2. It would be appreciated that this is only illustrative, without suggesting any limitation to the protection scope of the present disclosure. In some alternative embodiments, respective parts of the mount rack 103 may have a uniform height. The presence of the mount rack 103 promotes modularization of the air cooling device 100, to thus facilitate deployment of the air cooling device 100.

For convenience in removing the heat exchange unit 102, in some embodiments, the heat exchange unit 102 may include a handle 1025 arranged at a predetermined position. For example, FIGS. 2 and 3 show that the handle 1025 is disposed on the top wall of the heat exchange unit 102. Moreover, in order to lock the heat exchange unit 102 in the mount rack 103, in some embodiments, the mount rack 103 may also have a lock device arranged thereon. A locking structure such as a groove, hole, buckle, or the like, for mating with the locking device may be arranged on a corresponding position on the heat exchange unit 102. After the heat exchange unit 102 is arranged in the mount rack 103 in place, the locking device can be automatically or manually mated to the locking structure to lock the heat exchange unit 102 in the mount rack 103. When the heat exchange unit 102 needs to be replaced or maintained, the handle 1025 is further operated after the locking device is unlocked, to remove the heat exchange unit 102 from the mount rack 103 and mount a new heat exchange unit 102.

It would be appreciated that the embodiment where the heat exchange unit 102 is indirectly attached to the air cooling groove 1011 using a mount rack 103 is provided only illustratively, without suggesting any limitation to the protection scope of the present disclosure. The heat exchange unit 102 and the air cooling box 101 may be attached in any other appropriate manner. For example, in some alternative embodiments, the heat exchange unit 102 may be attached directly and detachably to the air cooling box 101 through, for example, snap-fit, a fastener and an engagement slot, and the like. Hereinafter, the idea of the present disclosure will be described in the case of deployment achieved when the heat exchange unit 102 and the air cooling box 101 are coupled to the mount rack 103. It would be appreciated that other coupling manners between the heat exchange unit 102 and the air cooling groove 1011 are also similar, which will be omitted below for brevity.

It is worth noting that the air cooling device 100 according to the embodiments of the present disclosure is a miniaturized device. Specifically, in some embodiments, the width W of the modular air cooling device 100 in the arrangement direction of electronic devices may not be greater than 1.5 times the height H thereof, or the width of the modular air cooling device 100 is at most 30 U. U is a unit of an external size of an electronic device such as a server, which is an abbreviation of unit. For example, the width of the air cooling device 100 in the arrangement direction of the electronic devices may be less than the height H thereof. In some alternative embodiments, the width of the modular air cooling device 100 in the arrangement direction of electronic devices may be less than half of the height H thereof. Considering the size of the common electronic device 200, the height H of the air cooling device 100 is typically about 1 m. That is, in some embodiments, the width of the modular air cooling device in the arrangement direction may not be greater than 1.5 m, for example, less than 1 m or 0.5 m. Therefore, the air cooling device 100 can have a miniaturized size.

In other words, for the air cooling device 100 according to the present disclosure, the width of the entire air cooling device 100 (including the air cooling groove 1011 and the heat exchange unit 102) in the arrangement direction is not greater than 1.5 m, for example, 1 m or less than 1 m. As the air cooling device 100 according to the embodiments of the present disclosure has a miniaturized size, on one hand, the operator can perform operations and maintenance on the electronic devices 200 therein in respective directions of the air cooling device 100, to make the maintenance easier and avoid mis-operations, thus improving the maintenance reliability and efficiency.

On the other hand, since a miniaturized air cooling groove 1011 is used in the miniaturized air cooling device 100, a small number of electronic devices 200 are placed in each air cooling groove 1011. For enterprises that only need a small number of electronic devices 200, this can reduce the operating costs of electronic devices 200 while not impacting the application of the modular air cooling device 100 to a large-scale data center. Specifically, although a small number of electronic devices 200 are placed in the air cooling groove 1011, a plurality of air cooling modules can be deployed rapidly and conveniently to meet the requirements of a large-scale data center, due to the modular structure and advantages of facilitating deployment and the like, as mentioned above.

In addition, the advantages of the miniaturized air cooling device 100 further include: because of the small number of electronic devices 200 placed in the air cooling groove 1011, if one of the air cooling devices 100 failed, the impact and losses incurred can be reduced significantly, to thus further reduce the failure costs and the maintenance costs.

More importantly, the miniaturized air cooling device 100, together with a miniaturized immersion liquid cooling device 303, can be deployed in the same cooling system, to improve the compatibility of the cooling system in a cost-effective way.

Figure 4:
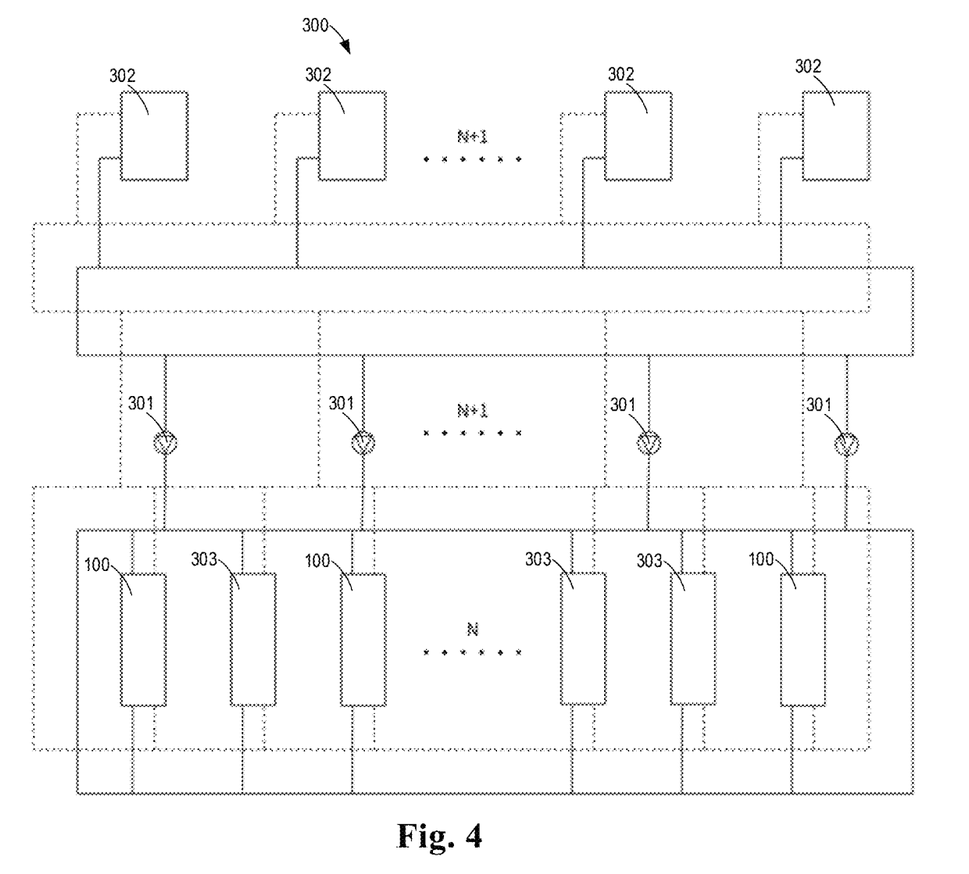
FIG. 4 is a schematic diagram of a deployment of a cooling system according to embodiments of the present disclosure.
Figure 5:
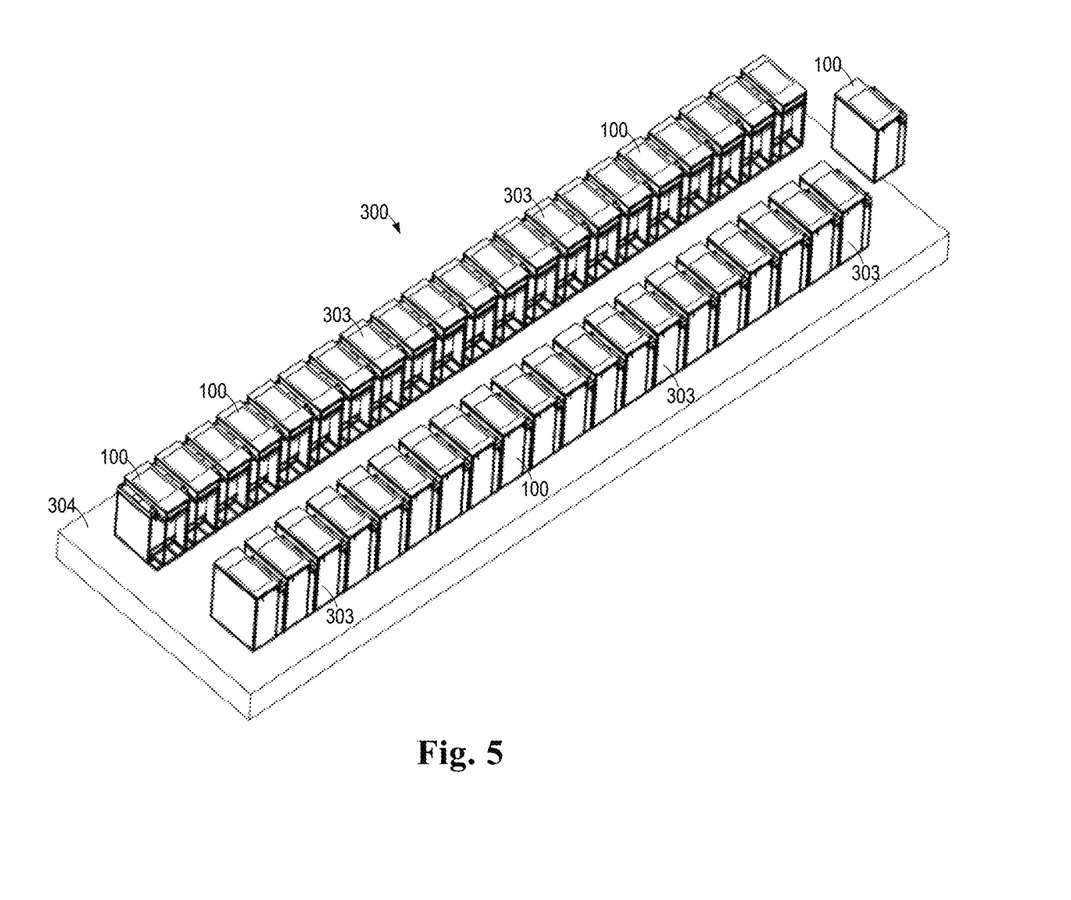
FIG. 5 is a schematic diagram of an array of immersion liquid cooling devices and modular air cooling devices in a cooling system according to embodiments of the present disclosure.

FIG. 4 is a schematic diagram of architecture of a cooling system including the modular air cooling device 110 according to embodiments of the present disclosure, and FIG. 5 is a schematic diagram of arrangement of a plurality of air cooling devices 100 in the cooling system according to embodiments of the present disclosure.

In general, the air cooling system according to the embodiments of the present disclosure includes at least one of the air cooling device 100 as described above, and a cooling medium circulation device 301. Although the cooling system shown in FIGS. 4 and 5 includes a plurality of air cooling devices 100, it would be appreciated that this is provided illustratively, without suggesting any limitation to the protection scope of the present disclosure. According to the requirements of different data centers, the number of the air cooling devices 100 may be one or multiple.

Further, as shown in FIGS. 4 and 5, in some embodiments, the cooling system may also include a plurality of immersion liquid cooling devices 303, in addition to the plurality of air cooling devices 100 according to the embodiments of the present disclosure. The immersion liquid cooling device 303 is a device for immersing electronic devices 200 in a cooling liquid to achieve cooling. The immersion liquid cooling device 303 has the same size as the air cooling device 100 as described herein, and includes a similar cooling interface 1022. For differentiation, the cooling interface 1022 for the immersion air cooling device 100 is called cold source interface.

In the way, this is particularly advantageous in the case where some of the electronic devices 200 are unable to be cooled though liquid cooling in the background of large-scale deployment of liquid cooling systems. A hybrid cooling system can be formed by deploying the modular air cooling devices 100 with the immersion liquid cooling devices 303. On one hand, the arrangement does not impact the large-scale deployment of immersion liquid cooling systems, to more effectively cool the electronic devices 200 unable to be cooled through liquid cooling. On the other hand, for the electronic devices 200 unable to be cooled through liquid cooling, there is no need for specifically providing an independent air cooling system for cooling those electronic devices. Instead, it is only required to deploy those electronic devices, together with the electronic devices 200 that can be cooled through liquid cooling, in the same data center, and effective cooling can be achieved. As such, while significantly reducing the costs, the present disclosure can solve the problem that the electronic devices in the air cooling system and the liquid cooling system independent of each other are interconnected. Moreover, the arrangement can greatly improve the compatibility of the cooling system. In this way, the deployment speed and flexibility of the data center can be improved effectively.

As mentioned above, in some embodiments, for deployment of air cooling devices 100, the cooling system may include a plurality of reserved interfaces. The reserved interfaces connect with the external cold source 302 via the cooling medium circulation device 301, and can be coupled to the cold source interface of the immersion liquid cooling device 303 and the cooling interface of the air cooling device 100 according to the embodiments of the present disclosure. In this way, the heat exchanger 1021 in the air cooling device 100 can communicate with the external cold source 302 via the cooling medium circulation device 301. As stated previously, the external cold source 302 may be a cooling tower in some embodiments.

The arrangement can effectively reduce the data center investment and operating costs such that the overall power usage effectiveness indicator of the data center can be controlled at 1.1 or even lower. For example, when a liquid cooling system for a data center is designed, considering that the data center may be of a larger scale in the future, a predetermined number of reserved interfaces and air cooling devices 100 are provided to meet the requirements of a larger number of servers in the future data center. For the number of electronic devices 200, considering a relatively small number of servers initially required in the data center, a small number of electronic devices 200 may be arranged in a part of the immersion liquid cooling devices 303 and/or the air cooling devices 100 according to the embodiments of the present disclosure. For electronic devices 200 unable to be cooled through immersion liquid cooling, both the air cooling devices 100 according to the embodiments of the present disclosure and the immersion liquid cooling device 303 may be arranged in the cooling system. When the scale of the data center needs to be expanded in the future with the increment of services, it is only required to add servers as required and arrange them in the immersion liquid cooling devices 303 having a cooling liquid, rather than arrange the electronic devices 200 unable to be cooled through liquid cooling in the air cooling devices 100. Therefore, the present disclosure can effectively reduce the initial investment and overall operating costs of the data center, and can make the adjustment of the data center simpler and more flexible.

In some alternative embodiments, only a number of the air cooling devices 100 and the liquid cooling devices corresponding to the number of the electronic devices 200 such as servers are deployed, and the cooling interfaces 1022 of the air cooling devices 100 and the cold source interfaces of the liquid cooling devices are coupled to a part of the reserved interfaces to thus effectively cool those electronic devices 200. When additional servers are required with the increment of services, it is only required to add electronic devices 200, correspondingly increase the number of the air cooling devices 100 and the liquid cooling devices depending on the number of the added electronic devices, and couple the cooling interfaces 1022 of the air cooling devices 100 and the cold source interfaces of the liquid cooling devices to the remaining reserved interfaces until the deployment of the entire liquid cooling system is completed.

In addition, during deployment of the modular air cooling devices 100 according to the embodiments of the present disclosure, it is only required to connect the cooling medium to the air cooling devices 100 via the cooling interfaces 1022, without the need for arranging an extra cold amount distribution unit. This remarkably simplifies the design of the cooling system and reduces the deployment difficulty, thus effectively improving the efficiency and reducing the costs.

In some embodiments, in order to further simplify the deployment, the cooling system may also include a base 304. At predetermined positions on the base 304 may be arranged grooves or adaption portions for arrangement of the air cooling devices 100 and the liquid cooling devices, and corresponding reserved interfaces. In this way, when there is a need for deploying the air cooling devices 100 and the liquid cooling devices, it is only required to arrange the air cooling devices 100 and the liquid cooling devices in the adaption portions of the base 304, and connect the cooling interfaces 1022 and the cold source interfaces to the reserved interfaces. Therefore, the present disclosure further simplifies the deployment of the cooling system.

For example, during a large-scale cluster deployment of electronic devices 200, the base 304 are arranged in the data center in advance, and the external cold source 302, the cooling medium circulation device 301 and the reserved interfaces are debugged in advance. At the initial stage of the data center construction, only a small number of electronic devices 200 may be used to meet the needs of a small amount of services. With the increment of services, further electronic devices 200 may be purchased and deployed in the cooling system to complete the deployment of the whole system. With the base 304, the data center deployment time can be further shorted while improving the deployment efficiency.

The embodiments of the cooling system where the air cooling devices 100 and the liquid cooling devices 303 are deployed together in the data center have been described above with reference to FIGS. 4 and 5. It would be appreciated that, in some embodiments, a plurality of the air cooling devices 100 according to the embodiments of the present disclosure may be deployed in the air cooling system independently of the liquid cooling devices 303, according to different needs. Due to the modular design of the air cooling devices 100, the deployment can also improve the deployment efficiency of the air cooling system. For example, in the case of a small number of electronic devices and less generated heat at the early stage of the data center construction, the cooling system may be deployed as an air cooling system only. With the continuous development of the data center and increment of the heat generated by the electronic devices, since the air cooling devices 100 and the liquid cooling devices 303 have the same size and the same cooling interfaces, additional liquid cooling devices 303 may be added, or a part of the air cooling devices 101 may be replaced by liquid cooling devices 303 to form the hybrid cooling system as described above, so as to meet the cooling requirements. In this way, the present disclosure can improve the deployment flexibility of the data center, and can reduce the initial investment costs of the data center.

It would be appreciated that the embodiments of the present disclosure, as described above in detail, are provided only for illustrating or explaining the principle of the present disclosure, rather than limit the latter. Therefore, any modification, equivalent substitution, improvement, and the like, made within the spirits and principle of the present disclosure should fall into the protection scope thereof. Furthermore, the claims appended hereafter are intended to cover all the changes and modifications within the scope and boundaries of the claims or equivalents of the scope and boundaries.

We claim:

1. A modular air cooling device, comprising:
   an air cooling box adapted to sealingly receive a predetermined number of electronic devices to be cooled; and
   a heat exchange unit coupled to the air cooling box and comprising:
     a housing sealingly enclosing a heat exchange chamber, the heat exchange chamber sealingly connecting with an interior of the air cooling box to allow air to circulate between the interior of the air cooling box and the heat exchange chamber as an effect of fans of the electronic devices;
     a heat exchanger arranged in the heat exchange chamber and comprising a path for enabling circulating air to circulate;
     a cooling interface at least partly arranged on the housing and adapted to allow a cooling medium to circulate between an external cold source and an interior of the heat exchanger to cool air flowing through the heat exchange; and
     a chiller arranged in the heat exchange chamber and connected between the cooling interface and the heat exchanger to adjust a temperature of the cooling medium entering the heat exchanger from the external cold source below a predetermined temperature.

2. The modular air cooling device of claim 1, further comprising:
   a mount rack for adopting the air cooling box and the heat exchange unit such that the heat exchange unit is arranged to a side of the air cooling box adjacently to the air cooling box.

3. The modular air cooling device of claim 1, wherein the heat exchange unit is detachably adopted in the mount rack.

4. The modular air cooling device of claim 1, wherein the predetermined number of electronic devices is arranged in the air cooling box along an arrangement direction, and
   the air cooling box and the heat exchange unit are arranged along the arrangement direction, and a width of the modular air cooling device in the arrangement direction is not greater than 1.5 times a height (H) of the modular air cooling device.

5. The modular air cooling device of claim 4, wherein the width (W) of the modular air cooling device in the arrangement direction is less than the height (H) of the modular air cooling device.

6. The modular air cooling device of claim 4, wherein the width (W) of the modular air cooling device is less than half of the height (H) of the modular air cooling device in the arrangement direction.

7. The modular air cooling device of claim 1, further comprising:
   a circulation through hole arranged between the air cooling box and the heat exchange chamber to allow the air to circulate between the air cooling box the heat exchange chamber.

8. The modular air cooling device of claim 7, wherein the circulation through hole comprises:
   an upper opening arranged on a top of the electronic devices or extending to a part above the top of the electronic devices in a vertical direction; and
   a lower opening arranged on a top of the electronic devices or extending to a part below the top of the electronic devices in the vertical direction.

9. The modular air cooling device of claim 1, wherein the cooling interface comprises at least two sets of cooling interfaces.

10. The modular air cooling device of claim 1, wherein the air cooling box comprises:
    an air cooling groove configured to adopt the predetermined number of the electronic devices and comprising a top opening for operating the electronic devices; and
    a cover body coupled to the air cooling groove to seal a top opening of the air cooling groove.

11. The modular air cooling device of claim 10, wherein the air cooling groove further comprises a bottom opening and a baffle sealingly covering the bottom opening, and
    the cover body and the baffle are capable to be opened automatically or manually to achieve emergency heat dissipation via the top opening and the bottom opening.

12. The modular air cooling device of claim 10, wherein the cover body is rotatably coupled to the air cooling groove via a hinge.

13. A cooling system for an electronic device, comprising:
    at least one of the modular air cooling device; and
    a cooling medium circulation device coupled to a cooling interface of the at least one modular air cooling device and adapted to allow the cooling medium to circulate between an external cold source and the heat exchanger,
    wherein the modular air cooling device comprises:
      an air cooling box adapted to sealingly receive a predetermined number of electronic devices to be cooled; and
      a heat exchange unit coupled to the air cooling box and comprising:
        a housing sealingly enclosing a heat exchange chamber, the heat exchange chamber sealingly connecting with an interior of the air cooling box to allow air to circulate between the interior of the air cooling box and the heat exchange chamber as an effect of fans of the electronic devices;
        a heat exchanger arranged in the heat exchange chamber and comprising a path for enabling circulating air to circulate;
        a cooling interface at least partly arranged on the housing and adapted to allow a cooling medium to circulate between an external cold source and an interior of the heat exchanger to cool air flowing through the heat exchange; and a chiller arranged in the heat exchange chamber and connected between the cooling interface and the heat exchanger to adjust a temperature of the cooling medium entering the heat exchanger from the external cold source below a predetermined temperature.

14. The cooling system of claim 13, wherein the at least one modular air cooling device comprises a plurality of modular air cooling devices, and the cooling system further comprises a plurality of reserved interfaces, the plurality of reserved interfaces being adapted to be coupled to the cooling interface.

15. The cooling system of claim 14, further comprising:
a base comprising a plurality of adaption portions arranged at predetermined positions, the base being for arrangements of the plurality of modular air cooling devices, the plurality of adaption portions being corresponded to the plurality of reserved interfaces.

16. The cooling system of claim 13, further comprising:
a plurality of immersion liquid cooling devices, each immersion liquid cooling device being adapted to cool the electronic device immersed therein, and having a size identical to a size of the modular air cooling device, and each immersion liquid cooling device being adapted to be arranged in the cooling system interchangeably with the modular air cooling device.

17. The cooling system of claim 13, wherein the cooling medium comprises deionized water.

18. A cooling system with a large-scale cluster deployment, comprising:
a base comprising a plurality of adaption portions arranged at predetermined positions;
a plurality of reserved interfaces corresponding to the positions of the plurality of adaption portions;
an auxiliary cooling device configured between the plurality of reserved interfaces and an external cold source;
a plurality of the modular air cooling devices arranged in a part of the plurality of adaption portions, cooling interfaces of the modular air cooling devices being coupled to the plurality of reserved interfaces; and
a plurality of immersion liquid cooling devices arranged in another part of the plurality of adaption portions and each comprising a cold source interface coupled to the reserved interface,
wherein the modular air cooling device comprises:
an air cooling box adapted to sealingly receive a predetermined number of electronic devices to be cooled; and
a heat exchange unit coupled to the air cooling box and comprising:
a housing sealingly enclosing a heat exchange chamber, the heat exchange chamber sealingly connecting with an interior of the air cooling box to allow air to circulate between the interior of the air cooling box and the heat exchange chamber as an effect of fans of the electronic devices; and
a heat exchanger arranged in the heat exchange chamber and comprising a path for enabling circulating air to circulate; and
a cooling interface at least partly arranged on the housing and adapted to allow a cooling medium to circulate between an external cold source and an interior of the heat exchanger to cool air flowing through the heat exchange.

19. The cooling system of claim 18, wherein the modular air cooling device and the immersion liquid cooling device have a same size.

* * * * *